United States Patent
Lubyshev et al.

(10) Patent No.: US 11,251,320 B2
(45) Date of Patent: Feb. 15, 2022

(54) PHOTODETECTOR STRUCTURES FORMED ON HIGH-INDEX SUBSTRATES

(71) Applicant: IQE plc, Cardiff (GB)

(72) Inventors: Dmitri Lubyshev, Bethlehem, PA (US); Joel Mark Fastenau, Bethlehem, PA (US); Amy Wing Kwan Liu, Mountain View, CA (US); Michael Vincent Kattner, Lehighton, PA (US); Philip Lee Frey, Bethlehem, PA (US); Scott Alan Nelson, River Falls, WI (US); Mark Justin Furlong, Woodstock (GB)

(73) Assignee: IQE plc, Cardiff (GB)

( * ) Notice: Subject to any disclaimer, the term of this patent is extended or adjusted under 35 U.S.C. 154(b) by 71 days.

(21) Appl. No.: 16/844,745

(22) Filed: Apr. 9, 2020

(65) Prior Publication Data
US 2020/0328315 A1      Oct. 15, 2020

Related U.S. Application Data

(60) Provisional application No. 62/832,639, filed on Apr. 11, 2019.

(51) Int. Cl.
| | |
|---|---|
| *H01L 29/06* | (2006.01) |
| *H01L 31/00* | (2006.01) |
| *H01L 31/0352* | (2006.01) |
| *H01L 31/0304* | (2006.01) |
| *H01L 31/036* | (2006.01) |
| *H01L 31/103* | (2006.01) |

(52) U.S. Cl.
CPC .. *H01L 31/035236* (2013.01); *H01L 31/0304* (2013.01); *H01L 31/036* (2013.01); *H01L 31/1035* (2013.01)

(58) Field of Classification Search
CPC ......... H01L 31/035236; H01L 31/0304; H01L 31/036; H01L 31/1035
USPC ............................................. 257/21
See application file for complete search history.

(56) References Cited

U.S. PATENT DOCUMENTS

| | | | |
|---|---|---|---|
| 9,466,739 B1 * | 10/2016 | Brueck | H01L 31/0304 |
| 2012/0145996 A1 | 6/2012 | Ting et al. | |
| 2016/0109699 A1 * | 4/2016 | Margallo Balbas | G02B 6/12004 |
| | | | 359/201.2 |

OTHER PUBLICATIONS

Shao et al., "Type-II InAs/GaSb superlattices grown on GaSb (311)B by molecular beam epitaxy for long-wavelength infrared application," J. Vac. Sci. Technol. B 24(4) 2144-2147 (2006).
(Continued)

*Primary Examiner* — Calvin Y Choi
(74) *Attorney, Agent, or Firm* — Sterne, Kessler, Goldstein & Fox P.L.L.C.

(57) ABSTRACT

A layered structure used for detecting incident light includes a substrate having a surface with a high Miller index crystal orientation and a superlattice structure formed over the substrate at the surface. The superlattice structure is aligned to the high Miller index crystal orientation and exhibits a red-shifted long wave infrared response range based on the crystal orientation as compared to a superlattice structure formed over a substrate at a surface with a (100) crystal orientation.

20 Claims, 8 Drawing Sheets

(56) References Cited

OTHER PUBLICATIONS

Lubyshev et al., "Effect of substrate orientation on Sb-based MWIR photodetector characteristics," Infrared Physics and Technology, 95:27-32 (2018).

Lubyshev et al., "T2SL mid- and long-wave infrared photodetector structure grown on (211)B and (311)A GaSb substrates," Infrared Technology and Applications XLV, Proc. of SPIE, vol. 11002 (2019) (9 pages).

* cited by examiner

PHOTODETECTOR STRUCTURES FORMED ON HIGH-INDEX SUBSTRATES

CROSS REFERENCE TO RELATED APPLICATION

This disclosure claims the benefit under 35 U.S.C. § 119(e) of U.S. Provisional Patent Application No. 62/832,639, filed Apr. 11, 2019, which is hereby incorporated by reference herein in its entirety.

BACKGROUND

Photodetectors generally provide an electronic signal indicative of incident light, over some spectral range. For example, some photodetector architectures employ bulk layers to effect photoelectric behavior, while other include superlattice structures (SLS). Typically, in the latter types, in order to increase an operational wavelength of a photodetector, an increased superlattice (SL) period is required, which can result in a reduced absorption coefficient per single SL period or per thickness unit of absorber material because absorption occurs at the interfaces of the SL where the wave functions overlap.

SUMMARY

The present disclosure is directed to layered structures including superlattices, that can be used for photodetection. Superlattices (SL) include a periodic structure of layers (e.g., an alternate layering of two materials, each layer having a prescribed thickness). By modifying a substrate crystal orientation on which the SL structure is formed, rather than changing the SL period or layer composition itself, the response of the photodetector may be modified without modifying the physical properties of the superlattice.

In some embodiments, the present disclosure is directed to photodetector growth on substrates having a (n11) Miller index orientation (e.g., a (211) or (311) orientation), resulting in a red-shift in the photoluminescence and cut-off wavelengths compared to material with the same SL period and alloy composition fabricated on substrates having a (100) orientation. This can enable a comparatively high quantum efficiency in an extended long wavelength range without changing a design of the SL.

The use of high-Miller index ("high-index") substrates (e.g., having surfaces along a (n11) lattice orientation) allows the resulting layered structure to take advantage of the inherent crystal polarity. Further, these substrates enable the formation of high performance (e.g., larger quantum efficiency) long-wave infrared (LWIR) photodetector structures.

A layered structure described in the present disclosure includes a substrate with a surface having a high-Miller-index (i.e., high-index) crystal orientation. For example, the layered structure may have a substrate that includes a (311)-oriented surface. In some embodiments, the layered structure includes a substrate having a III-V semiconductor material. For example, the semiconductor material may be GaSb. The layered structure includes a superlattice structure formed over the substrate at the surface. In some embodiments, the superlattice structure is directly formed over the substrate at the surface. The superlattice structure is aligned to the high-index crystal orientation. The superlattice structure may exhibit a red-shifted long wave infrared response range based on the high-index crystal orientation. For example, the superlattice structure epitaxially grown over the high-index-oriented surface may receive incident radiation including long wave infrared light. The superlattice structure aligned to the high-index orientation may respond to the long wave infrared light (e.g., by producing an electrical signal) at a wavelength that is red-shifted as compared to material with similar period and alloy composition on a (100)-oriented substrate.

In some embodiments, the layered structure includes a buffer layer formed over the substrate. In some embodiments, the buffer layer is directly formed over the substrate. The buffer may include a III-V semiconductor material. For example, the buffer layer epitaxially grown over the substrate may include GaSb.

In some embodiments, the superlattice structure includes or is an absorber. The absorber may include one or more compounds based on Group III and/or Group V elements. In some embodiments, the superlattice structure includes alternating layers based on one or more compounds of Group III and/or Group V elements. For example, the absorber may include a compound based on In and As. In some embodiments, the absorber includes a compound including Sb and/or Ga. For example, the superlattice structure may include or be an absorber made from alternating layers of InAs and GaSb. In other embodiments, the layered structure may include a superlattice structure that does not include Ga. For example, the superlattice structure may include an absorber made from alternating layers of InAsSb and InAs. In some embodiments, the superlattice structure and/or absorber includes alternating layers of binary, ternary, or some combination of binary and ternary compounds of Group III and/or Group V elements. For example, the superlattice structure may include alternating layers of InAsSb and InGaSb. In another non-limiting example, the absorber may include alternating layers of InAs and InGaSb.

In some embodiments, the layered structure includes a barrier layer that is formed over a superlattice structure. The barrier layer may include Group III and/or Group V elements. For example, the barrier layer epitaxially grown over the superlattice structure may include AlGaAsSb. In some embodiments, the layered structure includes a top layer over a barrier layer. In some embodiments, the top layer includes or is a contact layer. The contact layer may include alternating layers of one or more compounds based on Group III and/or Group V elements. For example, the contact layer epitaxially grown over the barrier layer may include alternating layers of InAsSb and InAs. In another example, the contact layer epitaxially grown over the barrier layer may include alternating layers of InAs and GaSb.

The layered structure as described in the present disclosure may exhibit a red-shifted long wave infrared (LWIR) response range. For example, the layered structure including a high-index-oriented substrate surface and a superlattice structure epitaxially grown over the surface and aligned to the high-index orientation may respond to incident light at a red-shifted wavelength compared to a superlattice structure grown over a (100) substrate. The red-shifted response range may be at least in part caused by piezo-electric effects and/or alloy ordering effects in the superlattice structure based on the high-index crystal orientation.

A photodetector or photo-sensitive device may include the layered structure including a substrate having a high-index-oriented surface and a SLS formed over the high-index-oriented surface. The photodetector may be configured to detect light in an extended long wave infrared range as compared to a photodetector including a superlattice structure formed over a (100)-oriented substrate surface. In some embodiments, the photodetector including the layered structure described herein includes a substrate having a (100)-oriented crystal surface. In such embodiments, the SLS formed over the high-index-oriented surface in the photodetector responds to incident light with a wavelength of at most equal to 15 microns (i.e., up to 15 micrometers). In such embodiments, the SLS formed over the high-index-oriented surface in the photodetector responds to incident light over an extended wavelength range as compared to a photodetector having a superlattice structure formed over a (100)-oriented surface and aligned to the (100)-oriented surface. For example, the photodetector may include a (100)-oriented substrate. The photodetector may include the layered structure having a (211)-oriented substrate surface and a superlattice structure epitaxially grown over the substrate surface and aligned to the (211) orientation. The photodetector may respond to a red-shift extended wavelength range as compared to a photodetector having a superlattice structure formed over a (100)-oriented surface and aligned to the (100)-oriented surface.

In some embodiments, the present disclosure is directed to techniques for detecting light, which includes forming photo-sensitive structures. The techniques include orienting a surface of a substrate along a high-Miller-index crystal orientation, forming a superlattice structure over the high-Miller-index surface, receiving incident radiation including long wave infrared light, and converting the incident radiation to an electronic signal over a red-shifted wavelength range as compared to a layered structure having a superlattice structure formed over a (100)-oriented substrate surface. In some embodiments, one or more radiative properties of the superlattice structure are affected by the high-index crystal orientation. The radiative properties may be affected at least in part by piezo-electric effects and/or alloy ordering effects in the superlattice structure based on the high-index crystal orientation. For example, the superlattice structure may exhibit a red-shifted long wave infrared response range based on the high-index crystal orientation. For example, a superlattice structure may be epitaxially grown over a substrate surface oriented to have Miller indices of (211). The superlattice structure grown over the (211)-oriented surface may receive incident radiation including long wave infrared light and respond to the long wave infrared light by converting the incident radiation to an electronic signal over the red-shifted long wave infrared response range.

BRIEF DESCRIPTION OF THE DRAWINGS

The present disclosure, in accordance with one or more various embodiments, is described in detail with reference to the following drawings. The drawings are provided for purposes of illustration only and merely depict typical or example embodiments. These drawings are provided to facilitate an understanding of the concepts disclosed herein and shall not be considered limiting of the breadth, scope, or applicability of these concepts. It should be noted that for clarity and ease of illustration these drawings are not necessarily made to scale.

DETAILED DESCRIPTION

The present disclosure is directed to layered structures including superlattices that can be used for photodetection. Superlattices include a periodic structure of layers (e.g., an alternate layering of two materials, each layer having a prescribed thickness). In some embodiments, photodetector operation is based on light absorption through direct optical transitions in type-II superlattices (SL). The absorption occurs between (e.g., at the interfaces of) spatially separated components of a period of the SL (e.g., indicative of layer thicknesses) where the wave functions from the conduction band in one layer (e.g., InAs) and the valence band in the other layer (e.g., InAsSb) overlap. By modifying the substrate crystal orientation on which the SL layer is formed, rather than changing the SL period or layer composition itself, the response of the photodetector may be modified without modifying the physical properties of the SL.

In some embodiments, the present disclosure is directed to photodetector growth on substrates having a (n11) Miller index orientation (e.g., a (211) or (311) orientation), resulting in a red-shift in the photoluminescence and cut-off wavelengths compared to material with the same SL period and alloy composition fabricated on substrates having a (100) orientation. This can enable a comparatively high quantum efficiency in an extended long wavelength range without changing a design of the SL.

The use of high-Miller index ("high-index") substrates (e.g., having surfaces along a (n11) lattice orientation) allows the resulting layered structure to take advantage of the inherent crystal polarity. Further, these substrates enable the formation of high performance (e.g., larger quantum efficiency) long-wave infrared (LWIR) photodetector structures. For example, layer structures exploit piezo-electric effects and/or alloy ordering in the high-index polar growth to extend the cutoff wavelengths (e.g., red-shift) without increasing the superlattice period, which can sacrifice quantum efficiency. A reduction of optical band gap is related to a build-up of electric field generated in the high-index orientations by distorted anion-cation bonds in SL interfaces between SL layers or by partial ternary alloy ordering in InAsSb (e.g., layer 203 illustrated in FIG. 2).

Figure 1:
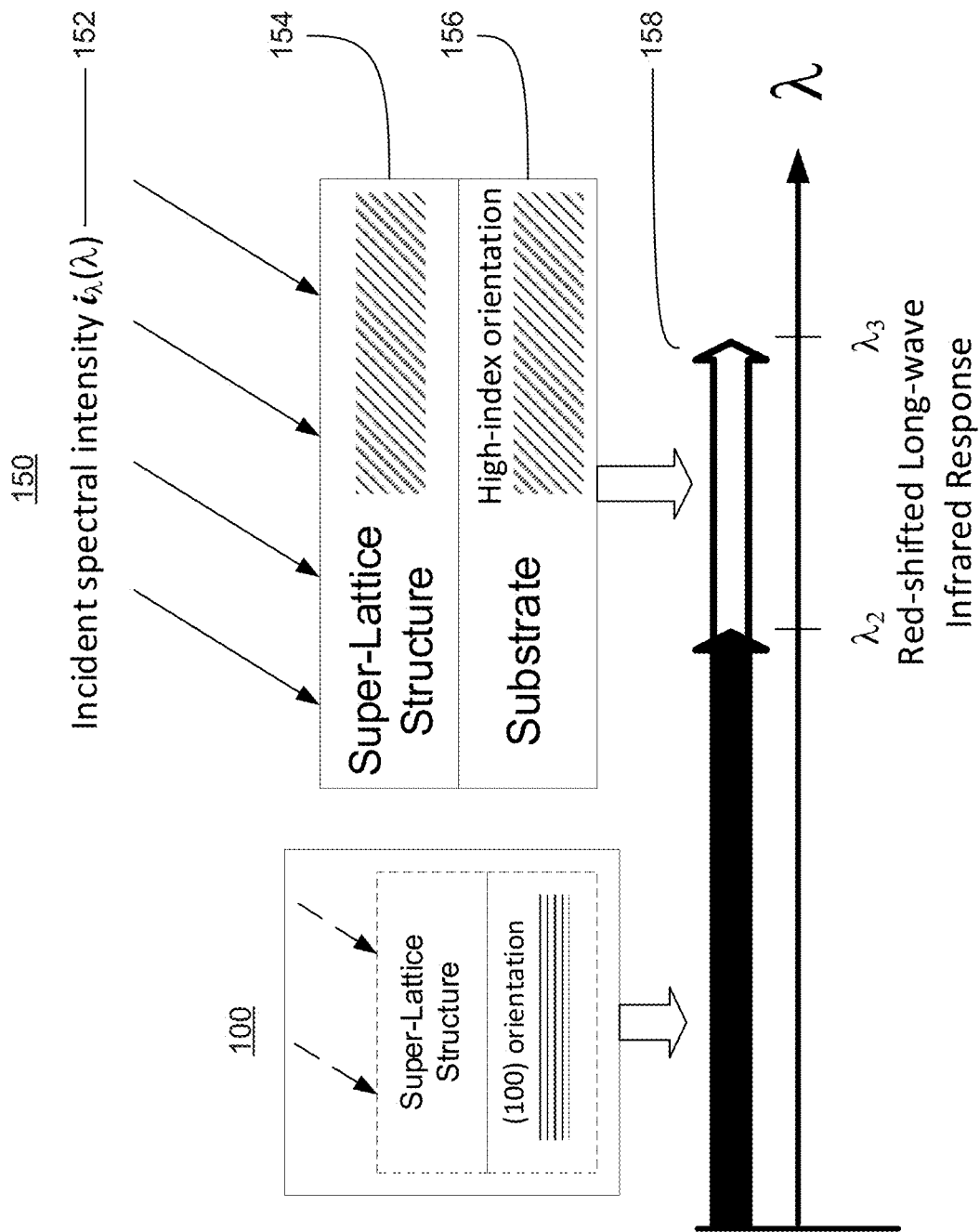
FIG. 1 shows two illustrative photodetection arrangements, in accordance with some embodiments of the present disclosure.

FIG. 1 shows two illustrative photodetection arrangements, in accordance with some embodiments of the present disclosure. Arrangement 100 includes a superlattice structure formed over a substrate at a surface aligned with a lattice plane having Miller indices <100>. Under irradiance from spectral intensity $i_\lambda(\lambda)$ including long-wave infrared (LWIR) light, interfaces of the superlattice generate an electrical effect. The response of arrangement 100 corresponds to a range in wavelength that includes an effective cut-off wavelength of $\lambda_2$, as illustrated. Arrangement 150 includes the same superlattice structure as arrangement 100 formed over a substrate at a surface aligned with a lattice plane corresponding to a larger Miller index (e.g., having Miller indices such as <n11>). Under irradiance from spectral intensity $i_\lambda(\lambda)$ including long-wave infrared (LWIR) light, interfaces of the superlattice generate an electrical effect. The response of arrangement 150 corresponds to a range in wavelength that includes an effective cut-off wavelength of $\lambda_3$, which is larger than $\lambda_2$ (e.g., red-shifted), as illustrated. Accordingly, by modifying the crystal orientation of the substrate on which the superlattice is formed, the photodetecting properties of the superlattice may be modified.

Figure 2:
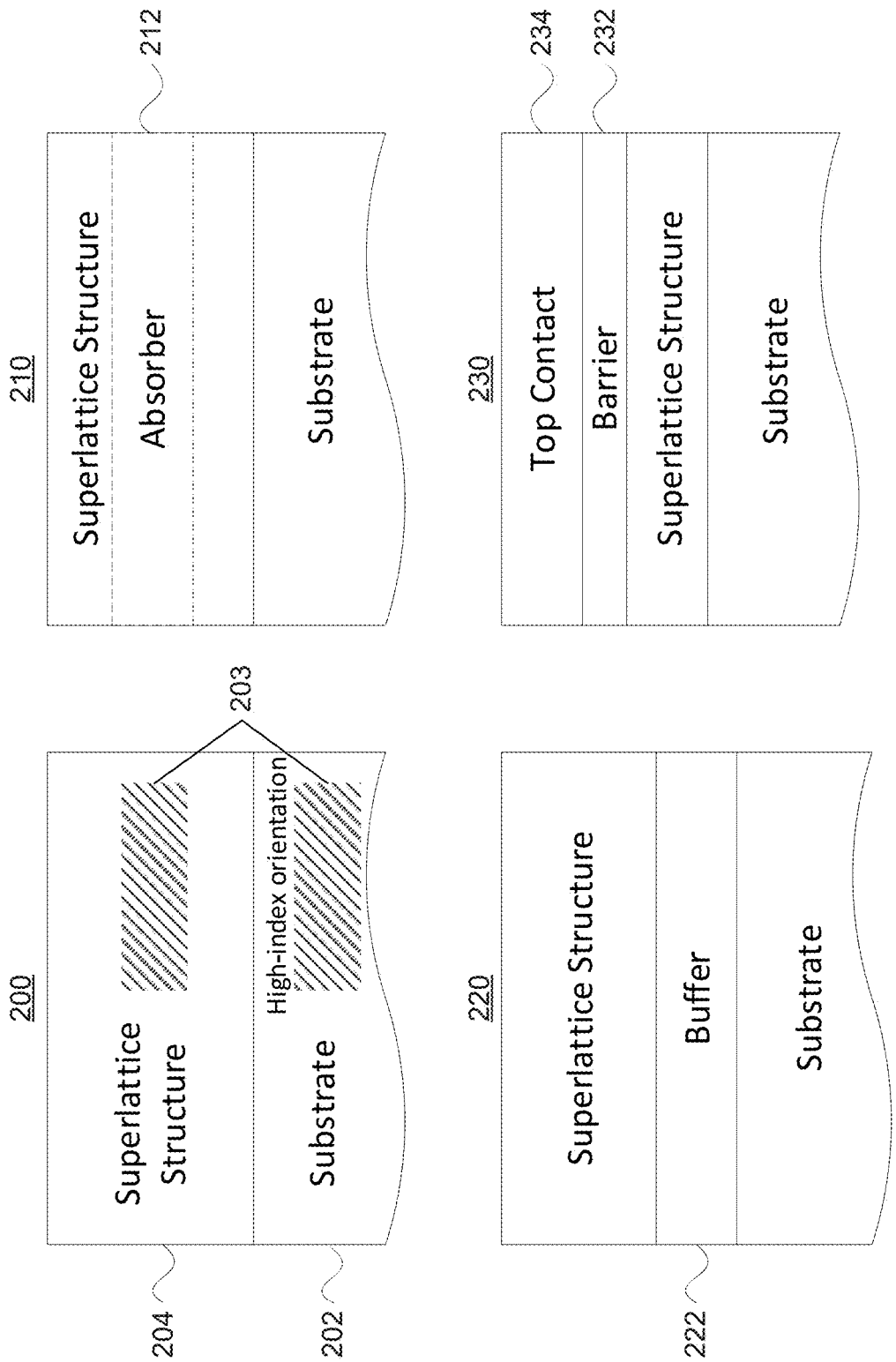
FIG. 2 shows cross-sectional views of illustrative layered structures including a superlattice structure aligned to a high-Miller-index orientation, in accordance with some embodiments of the present disclosure.

FIG. 2 shows cross-sectional views of illustrative layered structures 200-230, in accordance with some embodiments of the present disclosure. Layered structure 200 includes substrate 202 and superlattice structure 204. Substrate 202 includes a surface having high Miller index orientation 203. The surface may have high Miller index orientation 203 by including a crystal orientation with high Miller indices (e.g., Miller indices (n11)). Superlattice structure 204 is formed over the surface and aligned to the high-index crystal orientation 203. Structure 200 may be part of a high-performance SL LWIR photodetector structure. Formation of layer 202 structure 204 may be enabled using molecular beam epitaxy (MBE) on high-index polar substrates (e.g., a (n11)-oriented GaSb substrate). Other epitaxial techniques, such as metal-organic chemical vapor deposition (MOCVD), may also be used to produce structure 200. Layered structures 210-230 include layered structure 200 as described herein. Formation of structures 210-230 and associated layers may be enabled using MBE, MOCVD, and/or other epitaxial techniques as described herein.

Layered structure 210 includes a superlattice structure including layers that absorb radiation (i.e., absorber 212). In some embodiments, superlattice structure 204 is absorber 212. Absorber 212 may include alternating layers of one or more compounds based on Group III and/or Group V elements. For example, absorber 212 may include alternating layers of InAs and GaSb (which may be denoted by InAs/GaSb in the present disclosure). In another example, absorber 212 may include alternating layers of InAsSb and InAs (i.e., InAsSb/InAs). In some embodiments, the superlattice structure and/or absorber includes alternating layers of binary, ternary, or some combination of binary and ternary compounds of Group III and/or Group V elements. For example, superlattice structure 204 may include InAsSb/InGaSb. In another non-limiting example, absorber 212 may include InAs/InGaSb.

Layered structure 220 includes buffer layer 222 formed over substrate 202. In some embodiments, buffer layer 222 is directly formed over substrate 202. Buffer layer 222 may include a III-V semiconductor material (e.g., GaSb). Layered structure 230 includes barrier layer 232 and top layer 234. Barrier layer 232 may include a compound of Group III and V elements (e.g., AlGaAsSb). Top layer 234 may include or be a contact layer including one or more compounds of Group III and V elements. For example, the contact layer may be formed from alternating layers of InAsSb and InAs. In another example, the contact layer may be formed from alternating layers of InAs and GaSb.

Figure 3:
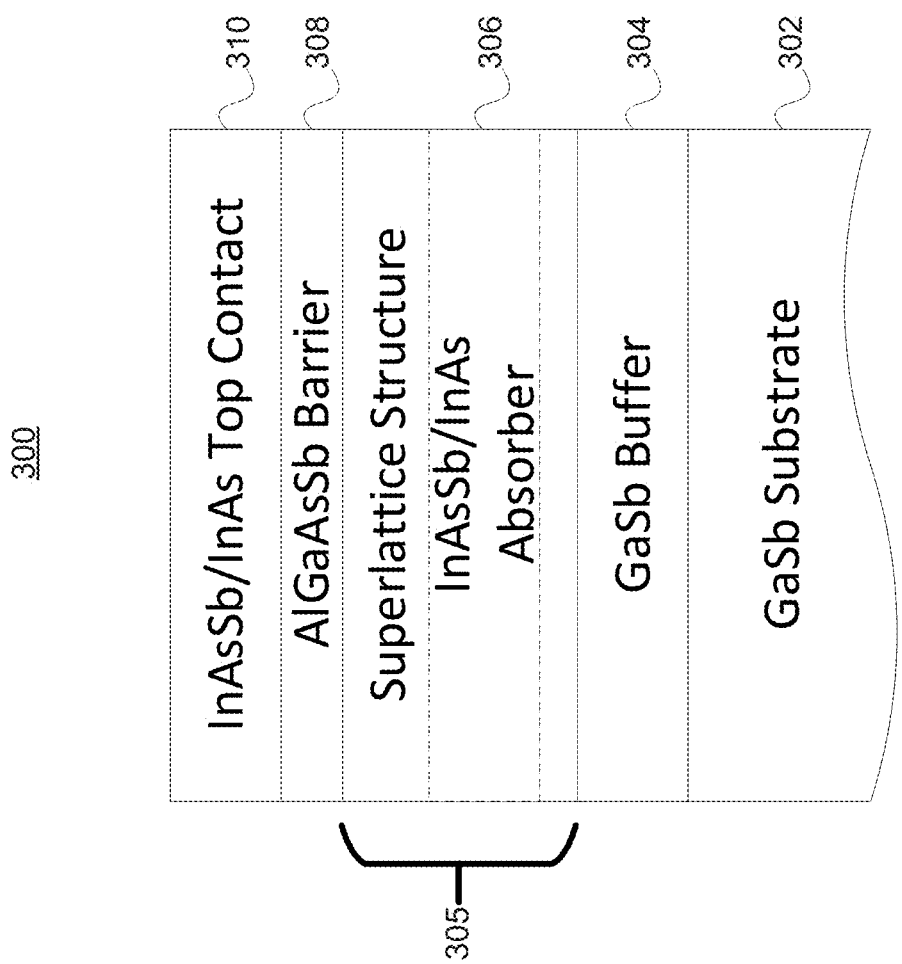
FIG. 3 shows a cross-sectional view of an illustrative layered structure including a superlattice structure, in accordance with some embodiments of the present disclosure.

FIG. 3 shows a cross-sectional view of illustrative layered structure 300 including superlattice structure 305, in accordance with some embodiments of the present disclosure. Structure 300 may illustrate a layered structure combining structures 200, 210, 220, and 230 as described in relation to FIG. 2. As illustrated, layered structure 300 includes substrate 302 (e.g., a GaSb substrate as illustrated), buffer layer 304 (e.g., a GaSb buffer layer as illustrated), superlattice structure 305 (e.g., including InAsSb/InAs absorber 306 as illustrated), barrier layer 308 (e.g., formed from an AlGaAsSb material as illustrated), and top layer 310 (e.g., a top contact layer formed of an InAsSb/InAs material as illustrated). The illustrative layers 302-310 shown in FIG. 3 are merely illustrative, and any suitable layers formed of any suitable material may be included, in accordance with the present disclosure. In some embodiments, one or more layers illustrated in FIG. 3 may be omitted. For example, in some embodiments, buffer layer 304 may be omitted.

Structure 300 illustrated in FIG. 3 may be an example of a high-performance Sb-based Ga-free Type-II SL LWIR photodetector structure. Formation of all layers 302-310 of structure 300 may be enabled by molecular beam epitaxy (MBE) on high-index polar substrates. For example, layer 302 may be formed from (n11) GaSb using MBE. Other epitaxial techniques, such as metal-organic chemical vapor deposition (MOCVD), may also be used to produce structure 300 and/or layers 302-310.

Figure 4:
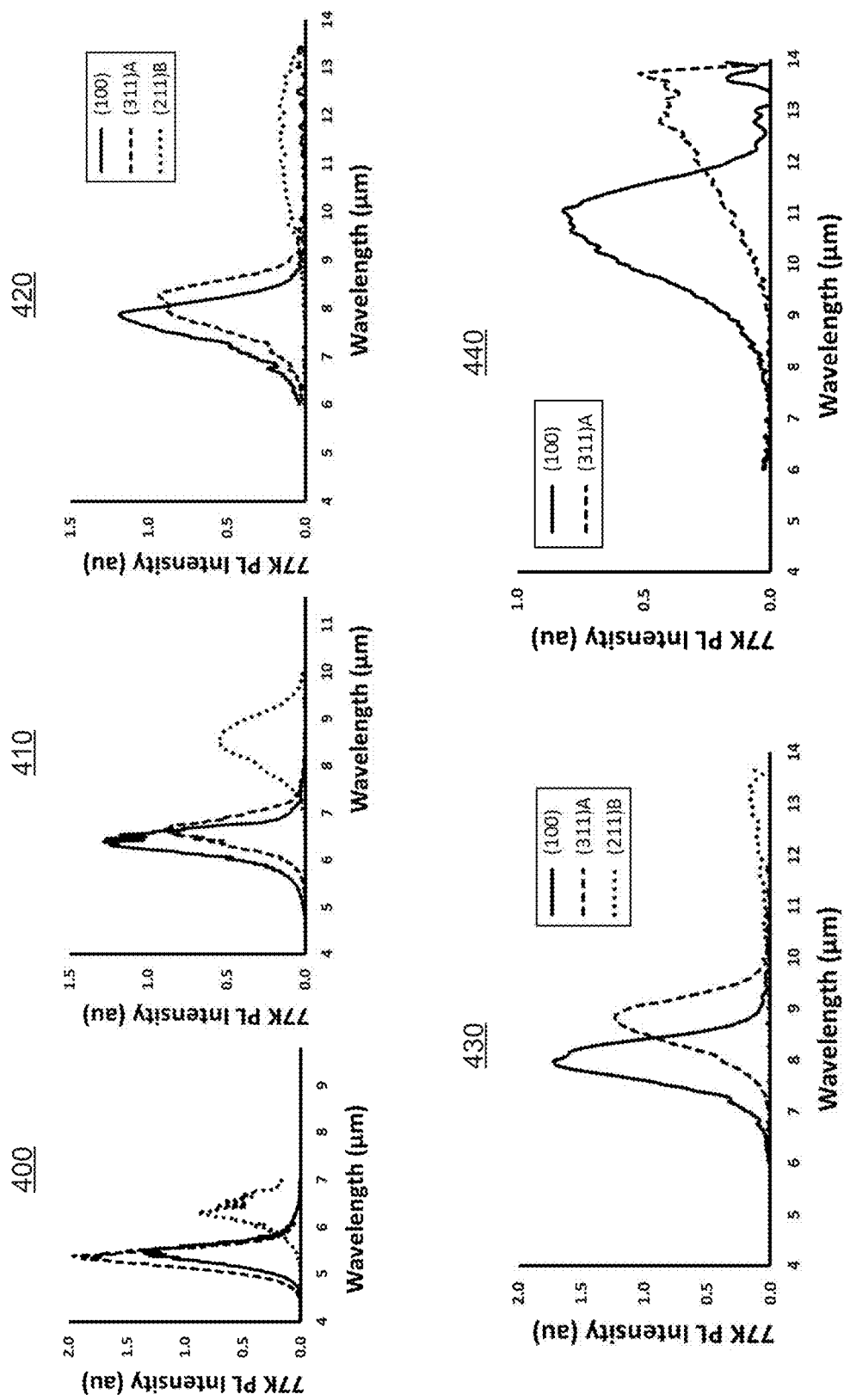
FIG. 4 shows several plots of photoluminescence intensity for layered structures, in accordance with some embodiments of the present disclosure.

FIG. 4 shows several plots 400, 410, 420, 430, and 440 of photoluminescence intensity for layered structures, in accordance with some embodiments of the present disclosure. Plot 410 shows photoluminescence (PL) intensity for three structures as a function of wavelength. Plot 420 shows photoluminescence (PL) intensity for three structures as a function of wavelength. Plot 430 shows photoluminescence (PL) intensity for three structures as a function of wavelength. Plot 440 shows photoluminescence (PL) intensity for three structures as a function of wavelength.

The data shown in plots 400-440 correspond to example layered structures as illustrated in FIG. 3 with different orientations. Structure A has (311) orientation and structure B has (211) orientation (i.e., (311)A and (211)B, respectively). A reference structure (i.e., structure O or (100)) having a SLS grown over a (100)-oriented substrate surface is included in order to show the extended LWIR response range. Structures O, A, and B are included for comparison of the growth of an identical layered structure on the different unique substrate orientations. Plot 400 shows photoluminescence (PL) intensity for three structures as a function of wavelength. Plots 400-440 in FIG. 4 show the red shift of PL wavelength for SL detector material on (311)A and (211)B as compared to the same SL period and alloy composition SL structure on (100). Each individual plot represents a different SL detector design grown on the 3 different substrate orientations, demonstrating that the magnitude of the red shift increases with increasing wavelength on the (100) orientation.

Figure 5:
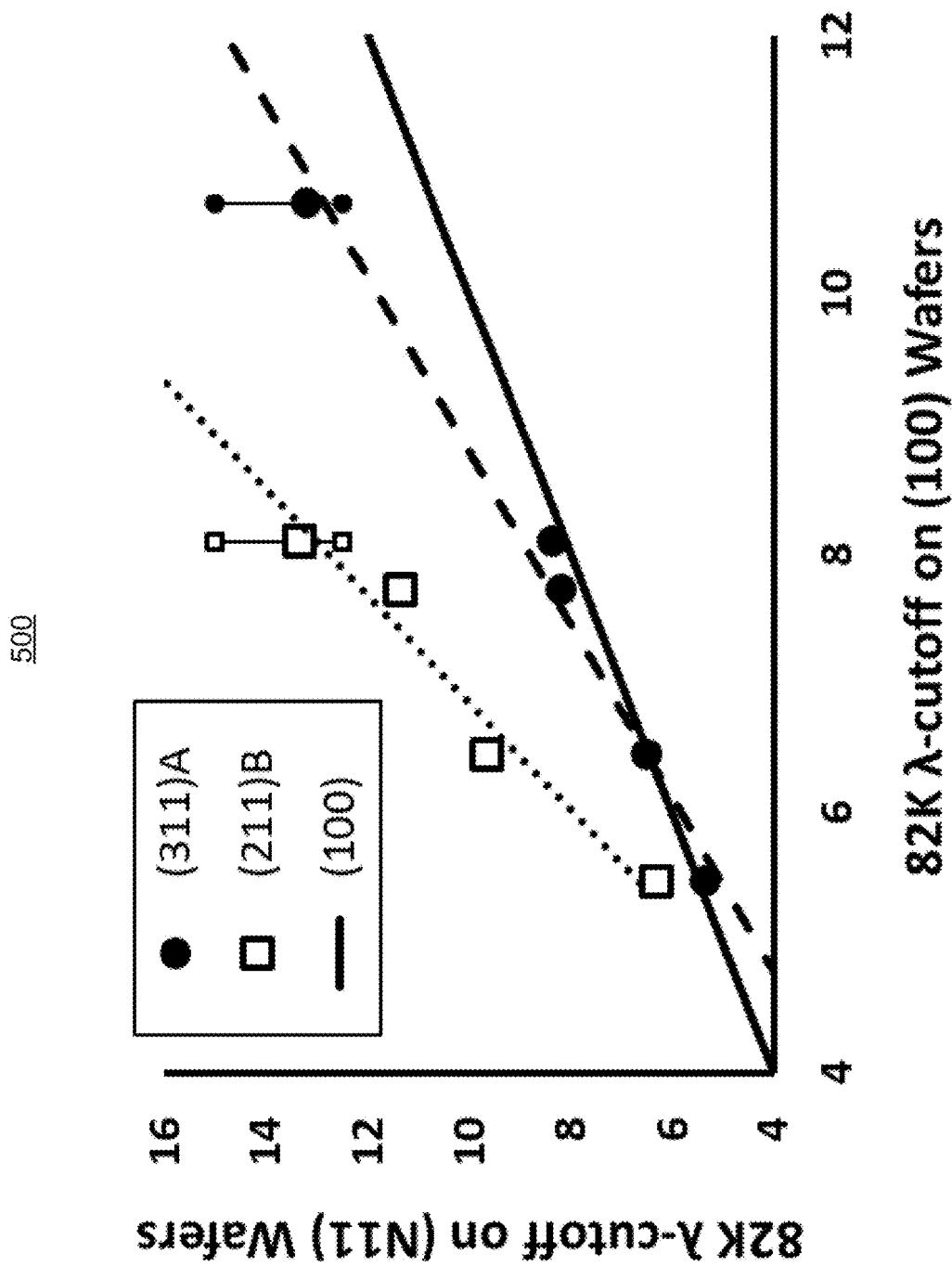
FIG. 5 shows a plot illustrating differences in cut-off wavelength (in microns) for (n11) and (100) crystal orientations of the substrate, in accordance with some embodiments of the present disclosure.

FIG. 5 shows plot 500 illustrating differences in cut-off wavelength (in microns) for (n11) and (100) crystal orientations of the substrate, in accordance with some embodiments of the present disclosure. The structures are Sb-based type-II superlattice (T2SL) IR photodetectors grown on the respective substrates. As illustrated, the structures formed on (311)A and (211)B oriented substrates indicate relatively greater wavelength cut-off than for the structure formed on (100) substrate.

Figure 6:
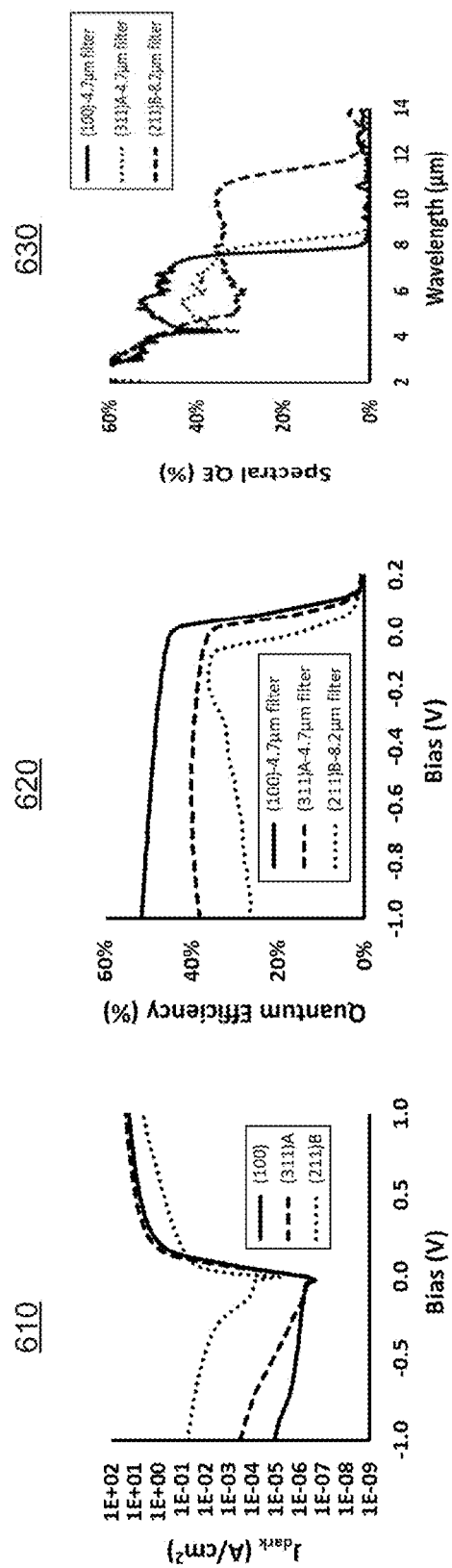
FIG. 6 shows illustrative photodetector results for a single layered structure, in accordance with some embodiments of the present disclosure.

FIG. 6 shows illustrative photodetector results for a single layered structure, in accordance with some embodiments of the present disclosure. The structure is a T2SL nBn photodetector, with the same structure grown on the respective substrates in a single MBE growth run. Structures having (100), (311)A, and (211)B orientations are included in a single arrangement while measuring performance for comparison.

Table 600 shows performance metrics for the structure formed on (100), (311)A, and (211)B substrates. Table 600 includes peak PL at 77K, dark current at $V_{ON}$, $V_{ON}$ value, quantum efficiency at $V_{ON}$, cut-off wavelength at $V_{ON}$, and band pass filter wavelength. For example, the (211)B-based structure provides more spectral response above a wavelength of 8.2 microns as compared to the other two structures.

Plot 610 shows dark current values for the three substrates, as a function of bias voltage. The increased dark current value for the (211)B structure correlates with the longer cut-off wavelength for this orientation, as displayed on plot 630.

Plot 620 shows long wave (LW) quantum efficiency (QE) for the three substrates, as a function of bias voltage. The QE values shown are partially a function of the optical filter used in the measurement (e.g., shown in the legend), whose selection were based in part to accommodate the cut-off wavelength (e.g., shown in table 600) of each sample.

Plot 630 shows spectral quantum efficiency (QE) for the three substrates. As illustrated in plot 630, the (211)B-based structure exhibits a red-shift of over 3 microns in wavelength as compared to the other substrates, for example.

Figure 7:
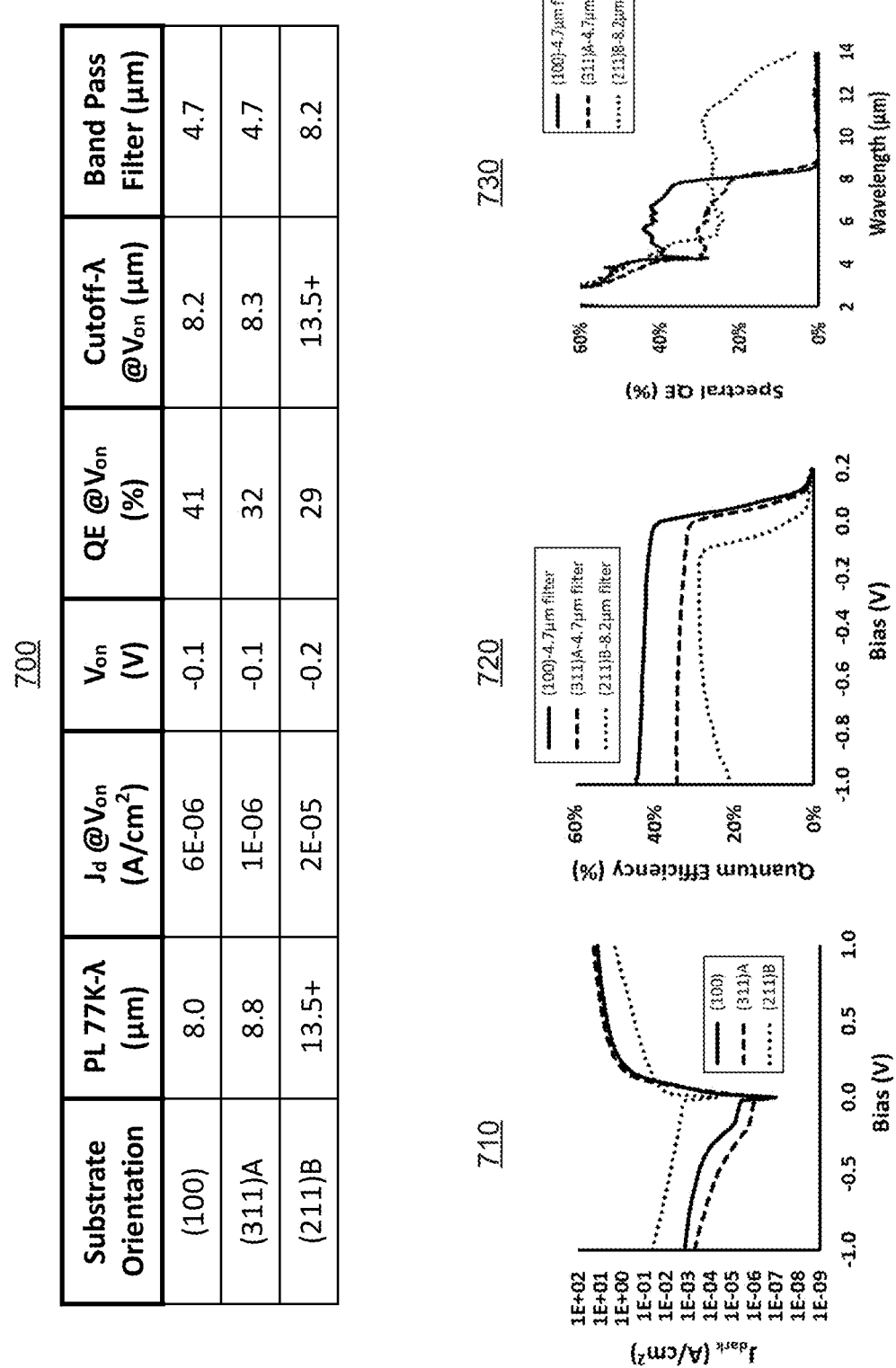
FIG. 7 shows illustrative photodetector results for a single layered structure, in accordance with some embodiments of the present disclosure.

FIG. 7 shows illustrative photodetector results for a single layered structure, in accordance with some embodiments of the present disclosure. The structure is a nBn T2SL photodetector, with the same structure grown on the respective substrates in a single MBE growth run. Structures having (100), (311)A, and (211)B orientations are included in a single arrangement while measuring performance for comparison. Note that the structure employed in FIG. 7 is different from that of FIG. 6, although both represent embodiments of the present disclosure.

Table 700 shows performance metrics for the structure formed on (100), (311)A, and (211)B substrates. Table 700 includes peak PL at 77K, dark current at $V_{ON}$, $V_{ON}$ value, quantum efficiency at $V_{ON}$, cut-off wavelength at $V_{ON}$, and band pass filter wavelength. For example, the (211)B-based structure provides more spectral response above a wavelength of 8.2 microns as compared to the other two structures.

Plot 710 shows dark current values for the three structures, as a function of bias voltage.

Plot 720 shows long wave (LW) quantum efficiency (QE) for the three structures, as a function of bias voltage. The QE values shown are partially a function of the optical filter used in the measurement (e.g., shown in the legend), whose selection were based in part to accommodate the cut-off wavelength (e.g., shown in table 700) of each sample.

Plot 730 shows spectral quantum efficiency (QE) for the three structures. As illustrated in plot 730, the (211)B-based structure exhibits a red-shift of over 5 microns in wavelength as compared to the (100)-based structure.

Figure 8:
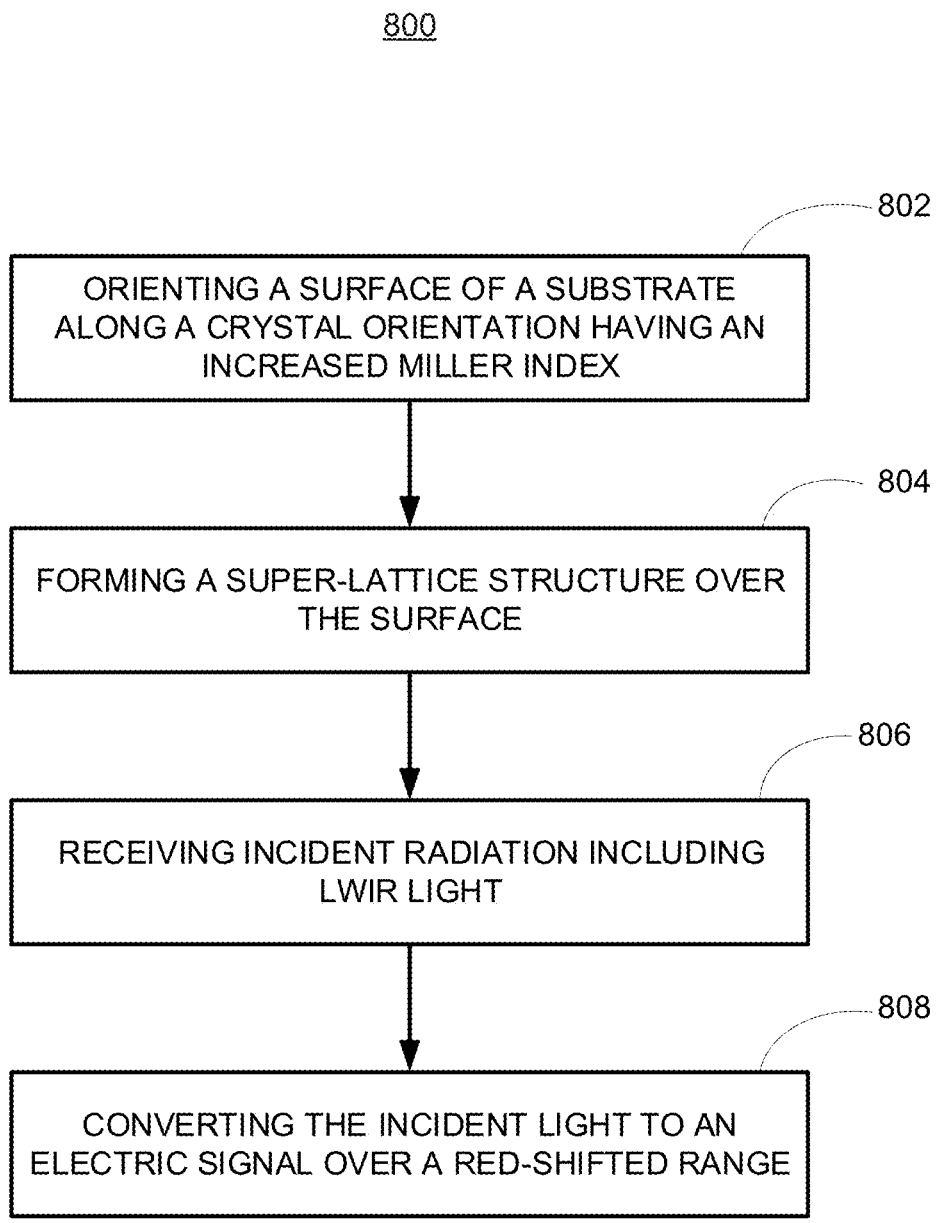
FIG. 8 shows a flowchart of an illustrative process for forming photo-sensitive structures that detect light, in accordance with some embodiments of the present disclosure.

FIG. 8 shows a flowchart of an illustrative process for forming photo-sensitive structures that detect light, in accordance with some embodiments of the present disclosure.

Step 802 includes orienting a surface of a substrate along a crystal orientation having Miller index greater than that of a standard (100) crystal orientation. In some embodiments, a substrate may be grown or otherwise formed in a particular orientation (e.g., an orientation desired for forming a superlattice (SL)). In some embodiments, a substrate may be grown or otherwise formed and then cleaved, ground, or otherwise cut along a desired orientation to form a surface having the desired orientation.

Step 804 includes forming a superlattice structure over the high-index-oriented surface, wherein one or more radiative properties of the superlattice structure are affected by the crystal orientation. In some embodiments, the radiative properties are affected at least in part by piezo-electric effects and/or alloy ordering effects in the superlattice structure based on the high-index crystal orientation. For example, the superlattice structure may exhibit a red-shifted long wave infrared response range based on the high-index crystal orientation. Any suitable technique may be used to form a SL over a substrate, optionally with a buffer layer in-between (e.g., as illustrated in FIGS. 2 and 3).

Step 806 includes receiving incident electromagnetic radiation comprising long wave infrared light. Incident radiation may arise from solar electromagnetic radiation, electromagnetic radiation from a process, any other suitable electromagnetic radiation, or any combination thereof. Incident electromagnetic radiation may include a large spectrum of wavelengths. The photodetector need not be configured to interact with the entire spectrum.

Step 808 includes converting the incident light to an electronic signal over a range that is red-shifted as compared to if the superlattice structure were formed over a surface aligned with the (100) crystal orientation of the substrate. The photodetector structures of the present disclosure are configured to provide an electrical current based on absorption of incoming photons of suitable wavelengths. In some embodiments, step 808 includes providing and maintaining a reverse bias to the photodetector. For example, a superlattice structure may be epitaxially grown over a substrate surface oriented to have Miller indices of (211). The superlattice structure grown over the (211)-oriented surface may receive incident radiation including long wave infrared light and respond to the long wave infrared light by converting the incident radiation to an electronic signal over the red-shifted long wave infrared response range.

The growth and/or deposition described herein may be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

As described herein, a layer means a substantially uniform thickness of a material covering a surface. A layer can be either continuous or discontinuous (i.e., having gaps between regions of the material). For example, a layer can completely or partially cover a surface, or be segmented into discrete regions, which collectively define the layer (i.e., regions formed using selective-area epitaxy).

Disposed on means "exists on" or "over" an underlying material or layer. This layer may include intermediate layers, such as transitional layers, necessary to ensure a suitable surface. For example, if a material is described to be "disposed on" or "over a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk gallium antimonide wafers, bulk indium antimonide wafers, bulk gallium arsenide wafers, bulk indium antimonide wafers, bulk gallium nitride wafers, bulk silicon carbide wafers, bulk sapphire wafers, bulk germanium wafers, bulk silicon wafers, in which a wafer comprises a homogeneous thickness of single-crystal material; composite wafers, such as a silicon-on-insulator wafer that comprises a layer of silicon that is disposed on a layer of silicon dioxide that is disposed on a bulk silicon handle wafer; or the porous germanium, germanium over oxide and silicon, germanium over silicon, patterned germanium, germanium tin over germanium, and/or the like; or any other material that serves as base layer upon which, or in which, devices are formed. Examples of such other materials that are suitable, as a function of the application, for use as substrate layers and bulk substrates include, without limitation, alumina, gallium-arsenide, indium-phosphide, silica, silicon dioxide, borosilicate glass, and pyrex. A substrate may have a single bulk wafer, or multiple sub-layers. Specifically, a substrate (e.g., silicon, germanium, etc.) may include multiple non-continuous porous portions. The multiple non-continuous porous portions may have different densities and may be horizontally distributed or vertically layered.

Semiconductor refers to any solid substance that has a conductivity between that of an insulator and that of most metals. An example semiconductor layer is composed of silicon. The semiconductor layer may include a single bulk wafer, or multiple sub-layers. Specifically, a silicon semiconductor layer may include multiple non-continuous porous portions. The multiple non-continuous porous portions may have different densities and may be horizontally distributed or vertically layered.

A first layer described and/or depicted herein as "configured on," "on," "formed over," or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Similarly, while operations may be depicted in the drawings in a particular order, this should not be understood as requiring that such operations be performed in the particular order shown or in sequential order, or that all illustrated operations be performed, to achieve desirable results. Accordingly, it is emphasized that this disclosure is not limited to the explicitly disclosed methods, systems, and apparatuses, but is intended to include variations to and modifications thereof.

What is claimed is:

1. A layered structure comprising:
   a substrate comprising a surface having a high-Miller-index crystal orientation; and
   a superlattice structure formed over the substrate at the surface,
   wherein the superlattice structure is aligned to the high-Miller-index crystal orientation, and
   wherein the superlattice structure exhibits a red-shifted long wave infrared response range based on the crystal orientation.

2. The layered structure of claim 1, wherein the high-Miller-index crystal orientation is a (n11) orientation.

3. The layered structure of claim 1, wherein the superlattice structure is gallium-free.

4. The layered structure of claim 1, wherein the superlattice structure comprises an absorber, the absorber comprising a compound of In and As.

5. The layered structure of claim 4, wherein the absorber comprises Ga.

6. The layered structure of claim 4, wherein the absorber comprises alternating layers of InAsSb and InAs.

7. The layered structure of claim 1, wherein the substrate comprises a III-V semiconductor material.

8. The layered structure of claim 7, wherein the III-V semiconductor material is GaSb.

9. The layered structure of claim 1, further comprising a barrier layer over the superlattice structure.

10. The layered structure of claim 9, further comprising a top layer over the barrier layer.

11. The layered structure of claim 10, wherein the top layer comprises a contact layer, the contact layer comprising a compound of a Group III element and a Group V element.

12. The layered structure of claim 1, further comprising a buffer layer formed over the substrate.

13. The layered structure of claim 12, wherein the buffer layer is formed directly over the substrate.

14. The layered structure of claim 12, wherein the buffer layer comprises a III-V semiconductor material.

15. The layered structure of claim 1, wherein the red-shifted long wave infrared response range is caused by piezo-electric effects or alloy ordering effects in the superlattice structure from the crystal orientation.

16. A photodetector configured to detect light in an extended long wave infrared range, the photodetector comprising:
    a layered structure comprising:
       a substrate comprising a surface having a high-Miller-index crystal orientation; and
       a superlattice structure formed over the substrate at the surface,
       wherein the superlattice structure is aligned to the high-Miller-index crystal orientation, and wherein the superlattice structure exhibits a red-shifted long wave infrared response range based on the crystal orientation.

17. The photodetector of claim 16, wherein:
the substrate comprises a (100) crystal orientation; and
the layered structure responds to incident light having a wavelength at most equal to 15 microns.

18. The photodetector of claim 16, wherein:
the substrate comprises a (100) crystal orientation; and
the layered structure responds to incident long wave infrared light over a larger range than if the superlattice structure were formed over a surface and aligned to the (100) crystal orientation.

19. A method of detecting incident light, the method comprising:
orienting a surface of a substrate along a crystal orientation having a higher Miller Index than the (100) crystal orientation;
forming a superlattice structure over the surface, wherein one or more radiative properties of the superlattice structure are affected by the crystal orientation;
receiving incident radiation comprising long wave infrared light; and
converting the incident light to an electronic signal over a range that is red-shifted as compared to if the superlattice structure were formed over a surface aligned with the (100) crystal orientation of the substrate.

20. The method of claim 19, wherein the one or more radiative properties of the superlattice structure are affected by piezo-electric effects or alloy ordering effects in the superlattice structure from the crystal orientation.

* * * * *